(12) United States Patent
Girdhar et al.

(10) Patent No.: US 8,368,166 B2
(45) Date of Patent: Feb. 5, 2013

(54) JUNCTION BARRIER SCHOTTKY DIODE

(75) Inventors: Dev Alok Girdhar, Indialantic, FL (US); Michael David Church, Sebastian, FL (US)

(73) Assignee: Intersil Americas Inc., Milpitas, CA (US)

( * ) Notice: Subject to any disclaimer, the term of this patent is extended or adjusted under 35 U.S.C. 154(b) by 344 days.

(21) Appl. No.: 12/868,346

(22) Filed: Aug. 25, 2010

(65) Prior Publication Data

US 2010/0314708 A1    Dec. 16, 2010

Related U.S. Application Data

(63) Continuation-in-part of application No. 12/107,177, filed on Apr. 22, 2008, now Pat. No. 7,829,970.

(60) Provisional application No. 60/940,730, filed on May 30, 2007.

(51) Int. Cl.
*H01L 27/095* (2006.01)
*H01L 29/47* (2006.01)
*H01L 31/07* (2012.01)

(52) U.S. Cl. ........ 257/475; 257/471; 257/473; 257/474; 257/E29.338

(58) Field of Classification Search .................. 257/471, 257/473, 474, 475, E29.338
See application file for complete search history.

(56) References Cited

U.S. PATENT DOCUMENTS

| | | | |
|---|---|---|---|
| 3,896,477 A * | 7/1975 | Hutson | 257/127 |
| 4,223,328 A * | 9/1980 | Terasawa et al. | 257/136 |
| 4,641,174 A | 2/1987 | Baliga | |
| 4,829,361 A | 5/1989 | Sagara et al. | |
| 4,975,755 A * | 12/1990 | Nishizawa | 257/114 |
| 5,017,976 A | 5/1991 | Sugita | |
| 6,861,723 B2 | 3/2005 | Willmeroth | |
| 7,358,127 B2 * | 4/2008 | Nemoto | 438/197 |
| 2004/0046224 A1 | 3/2004 | Rossel et al. | |
| 2005/0139947 A1 | 6/2005 | Okada et al. | |
| 2006/0237813 A1 | 10/2006 | Hshieh et al. | |
| 2006/0244050 A1 * | 11/2006 | Sudou | 257/324 |

FOREIGN PATENT DOCUMENTS

| | | |
|---|---|---|
| JP | 53-053270 | 5/1978 |
| JP | 2002-373943 | 12/2002 |
| JP | 2003-188391 | 7/2003 |

* cited by examiner

*Primary Examiner* — N Drew Richards
*Assistant Examiner* — John P Dulka
(74) *Attorney, Agent, or Firm* — Barnes & Thornburg LLP

(57) ABSTRACT

A junction barrier Schottky diode has N-type well having a surface and first peak impurity concentration; P-type anode region in surface of the well having second peak impurity concentration; N-type cathode contact region in surface of the well and laterally spaced from a first wall of the anode region having third peak impurity concentration; and first N-type region in surface of the well and laterally spaced from second wall of the anode region having fourth impurity concentration. Center of the spaced region between the first N-type region and the second wall of the anode region has fifth peak impurity concentration. Ohmic contact is made to the anode region and cathode contact region. Schottky contact is made to the first N-type region. First and fifth peak impurity concentrations are less than the fourth peak impurity concentration. The fourth peak impurity concentration is less than the second and third peak impurity concentrations.

11 Claims, 4 Drawing Sheets

JUNCTION BARRIER SCHOTTKY DIODE

CROSS REFERENCE

The present application is a continuation-in-part to U.S. patent application Ser. No. 12/107,177 filed Apr. 22, 2008, now U.S. Pat. No. 7,829,970 B2, which claims the benefit of U.S. provisional application Ser. No. 60/940,730 filed May 30, 2007 and both of which are incorporated herein by reference.

BACKGROUND AND SUMMARY OF THE DISCLOSURE

The present disclosure relates generally to a junction barrier Schottky diode (JBS) and, more specifically, to a junction barrier Schottky diode with higher reverse blocking voltage.

Integrated circuits have generally included Schottky diodes for power applications. Schottky diodes tend to be very leaky at high reverse bias and high temperatures. Circuit designers have used junction barrier Schottky diodes to provide a solution to the leaky Schottky diodes. This combination provides a Schottky-like forward conduction and PN diode like reverse blocking of voltage. It basically includes a PN junction and a Schottky junction diode in parallel Although this has solved the leakage problems, the JBS diodes built to date have historically had reverse blocking voltages in the range of 30 volts. There is a need to provide an improved JBS diode with substantially greater reverse blocking voltage.

The present junction barrier Schottky diode has an N-type well having a surface and a first peak impurity concentration along a vertical axis; a P-type anode region in the surface of the well, and having a second peak impurity concentration along a vertical axis; an N-type cathode contact region in the surface of the well and laterally spaced from a first wall of the anode region, and having a third peak impurity concentration along a vertical axis; and a first N-type region in the surface of the well and laterally spaced from a second wall of the anode region, and having a fourth peak impurity concentration along a vertical axis. The center of the spaced region between the first N-type region and the second wall of the anode region has a fifth peak impurity concentration along a horizontal axis. An ohmic contact is made to the anode region and the cathode contact region, and a Schottky contact is made to the first N-type region, the spaced region and the well. The first and fifth peak impurity concentrations are less than the fourth peak impurity concentration, and the fourth peak impurity concentration is less than the second and third peak impurity concentrations.

The second peak impurity concentration may be less than the third peak impurity concentration. The spaced region may be the well and the first and fifth peak impurity concentrations are equal. The fifth peak impurity concentration may be less than the first peak impurity concentration, and the fifth peak impurity concentration in the spaced region results from overlap of the anode and the first N-type regions.

The cathode contact, anode and first N-type regions may have substantially the same depth. The cathode contact, anode and first N-type regions may be concentric. One of the cathode contact, anode and first N-type regions may be between two spaced anode or first N-type regions, cathode contact or first N-type regions, and the cathode contact or anode regions respectively may be between two spaced cathode contact regions.

The maximum impurity concentration of the anode and/or the first N-type regions may be below the surface.

Although the junction barrier Schottky diode is generally used in integrated circuits, the present junction barrier Schottky diode may be a discrete device.

These and other aspects of the present disclosure will become apparent from the following detailed description of the disclosure, when considered in conjunction with accompanying drawings.

DETAILED DESCRIPTION OF THE PREFERRED EMBODIMENTS

Figure 1:
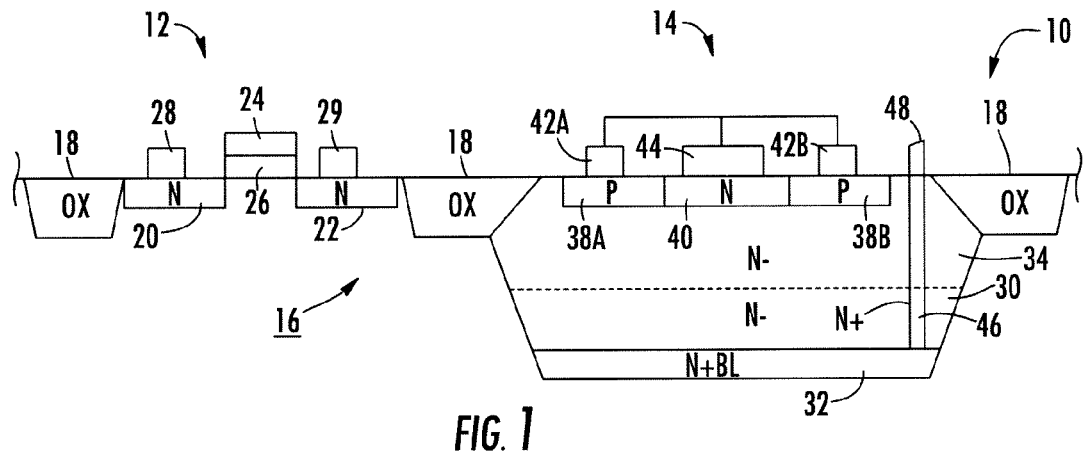
FIG. 1 is cross-sectional view of an integrated circuit including a junction barrier Schottky diode incorporating the principles of the present disclosure.

FIG. 1 illustrates an integrated circuit 10 including a field effect transistor FET 12 and a junction barrier Schottky diode 14. A p-type substrate 16 includes lateral oxide isolation regions 18 offering lateral isolation at the surface between various devices including the FET 12 and the JBS 14. The FET 12 is illustrated as including an N-type source 20 and drain 22 in the P-type substrate 16. A gate 24 is separated from the channel region between the source 20 and the drain 22 by a gate oxide 26. Source contact 28 and drain contact 29 are also shown.

The junction barrier Schottky diode 14 includes an N-type well 30 having a buried N+ layer 32. The upper portion or surface region of the JBS 14 includes an N− region 34. A pair of P-type anode regions 38A and 38B is formed in the surface of region 34. A cathode region 40 laterally adjacent the pair of anode regions 38. The N− region 34 of the well 30 has a lower peak impurity concentration than the peak concentrations of the P anode regions 38 and N cathode region 40. It also has a lower peak impurity concentration than the N well 30. It should be noted that the cathode region 40 has generally the same depth as the anodes 38 such that in the lateral or horizontal direction there is a higher impurity concentration between the anodes 38A and B while the lower or vertical abutment of the anodes 38A and B is with the lower impurity N− region 34. The plus and minus is to illustrate their relative impurity concentrations. A more detailed explanation of the impurity concentration are illustrated to be discussed below.

Figure 10:
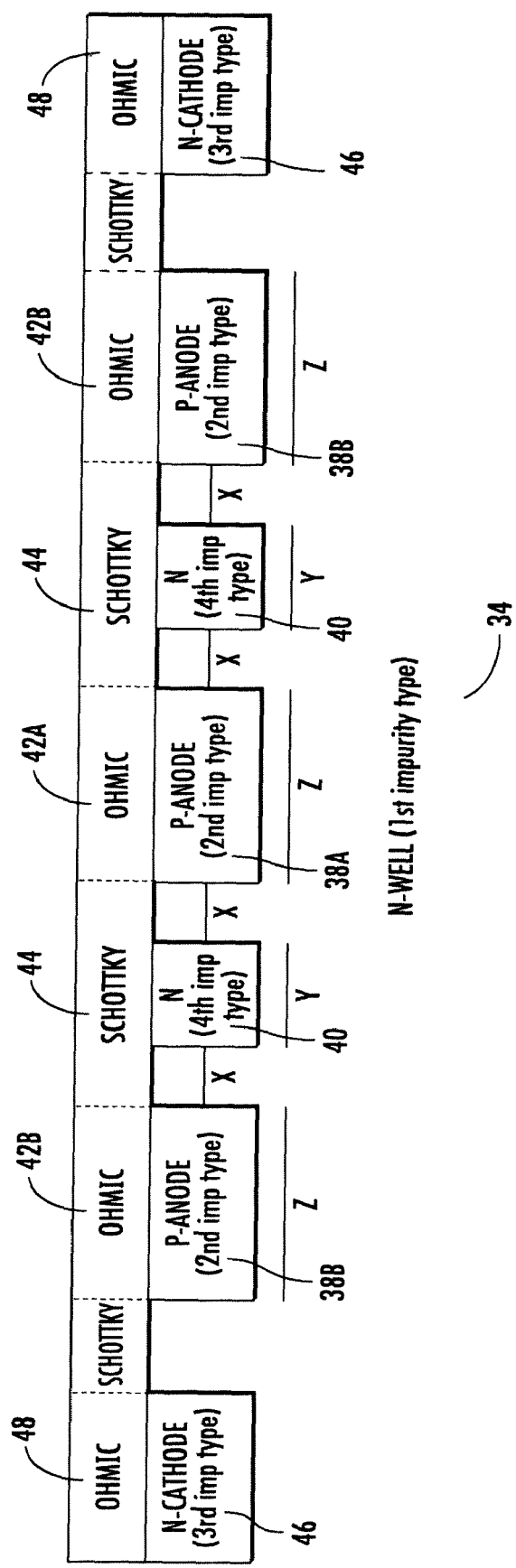
FIG. 10 is cross-sectional view of a second junction barrier Schottky diode incorporating the principles of the present disclosure.

Ohmic contacts 42A and 42B are made to the anode region 38A and 38B and a Schottky barrier contact 44 is made with cathode region 40. An N+ cathode contact region 46 extends from the surface to the N+ buried layer 32. An ohmic contact 48 is made to the cathode contact region 46. Materials that form these contacts to produce the appropriate functions are well-known. The cathode region 40 is an active cell partition. The N− region 34 is a lower doped region than the N+ burier layer 32, which carries the current laterally to the cathode. The anode ohmic contacts 42A and 42B and Schottky contact 44 are shown as connected to a common point. This may be by the interconnect structure or by extending the Schottky contact 44 laterally onto the P-region 38 as shown in FIG. 10.

Figure 6:
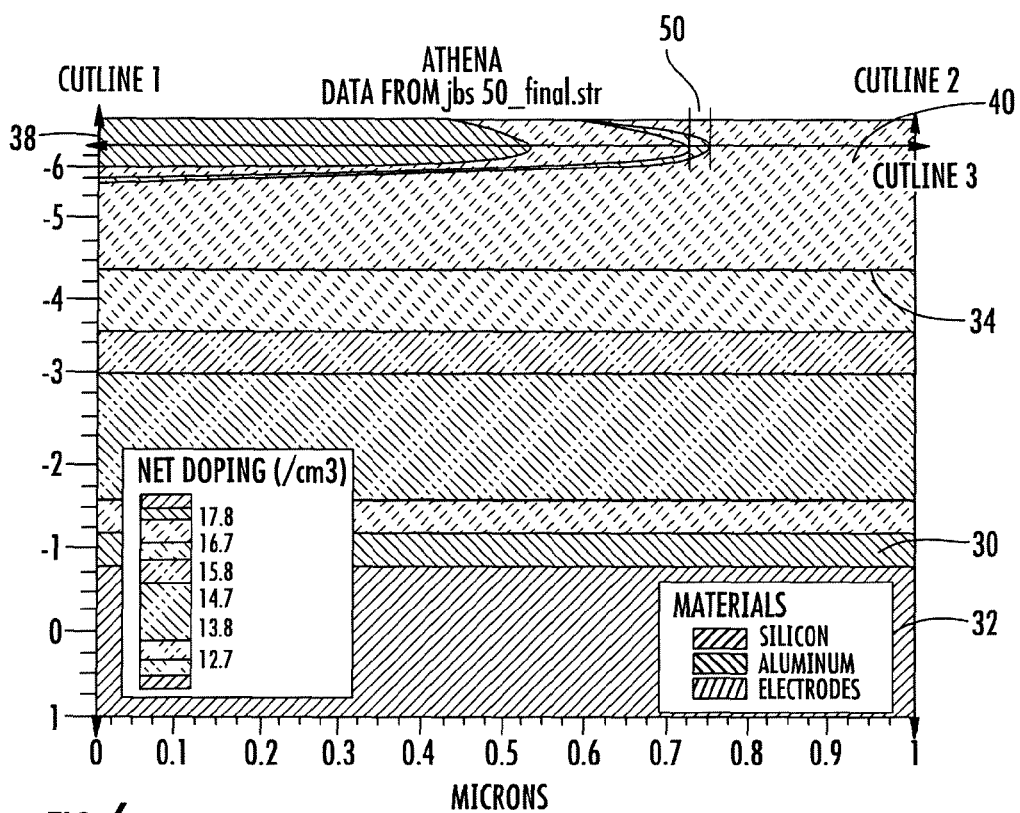
FIG. 6 is cross-sectional view of a first junction barrier Schottky diode incorporating the principles of the present disclosure.
Figure 8:
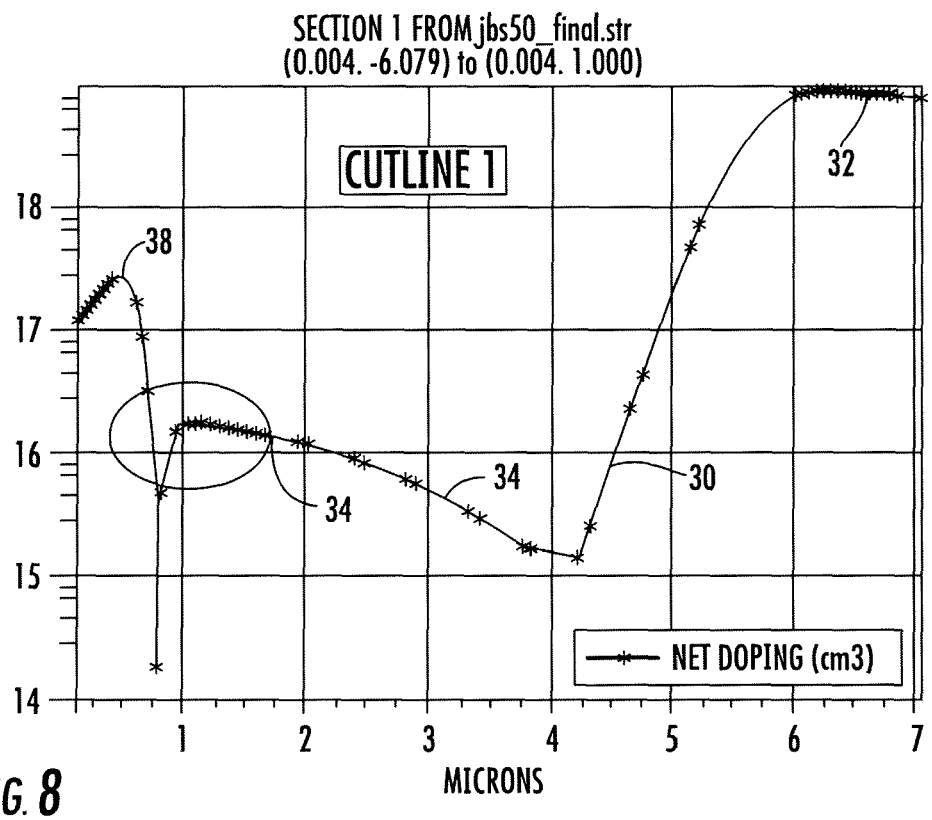
FIG. 8 is a graph of impurity concentration along cutline 1 of FIG. 6.

An example of a cross-section of the implementation of the junction barrier Schottky diode 10 is illustrated in FIG. 6. The P-region 38 is ion implanted and is selected to have a peak impurity concentration below the surface of the well 30 as illustrated in FIG. 8. In, the implementation shown, it is generally along the cutline 3 at about 0.5 microns from the surface. The N-region 40 is also formed by ion implantation. The example shown is for a JBS50 which indicates that for the one micron dimension, that the anode and cathode regions of the two parallel diodes are implanted to represent half of the one-micron dimension.

Figure 2:
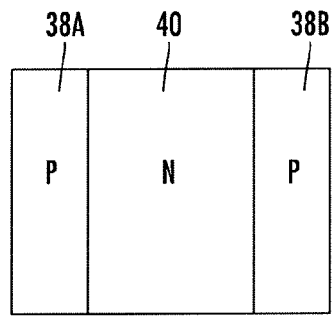
FIG. 2 is plain view of a first arrangement of the anode and cathode regions of a junction barrier Schottky diode incorporating the principles of the present disclosure.
Figure 3:
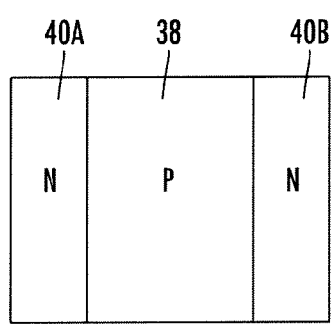
FIG. 3 is plain view of a second arrangement of the anode and cathode regions of a junction barrier Schottky diode incorporating the principles of the present disclosure.

The laterally adjacent the anode region 38 and the cathode region 40 may take various configurations. As previously mentioned, they are generally of the same depth from the surface of the well 30. In one embodiment illustrated in FIG. 2, the cathode region 40 separates to anode region 38A and 38B. As an alternative illustrated in FIG. 3, a single anode region 38 may separate a pair of cathode regions 40A and 40B. The space between the two anode regions 38A and 38B or the two cathode regions 40A and 40B is less than 1 micron and is selected for a specific forward voltage drop and leakage current.

Figure 4:
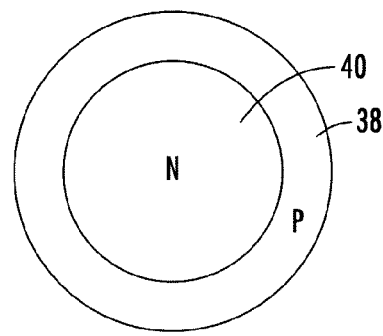
FIG. 4 is plain view of a third arrangement of the anode and cathode regions of a junction barrier Schottky diode incorporating the principles of the present disclosure.
Figure 5:
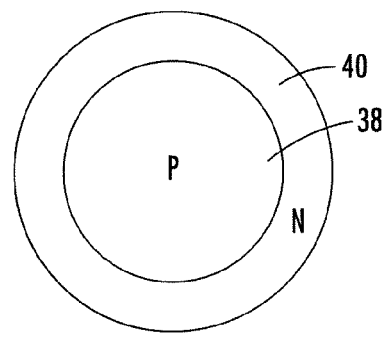
FIG. 5 is plain view of a fourth arrangement of the anode and cathode regions of a junction barrier Schottky diode incorporating the principles of the present disclosure.

A concentric embodiment is illustrated in FIGS. 4 and 5. In FIG. 4 the cathode region 40 is surrounded by the anode region 38. In FIG. 5 the anode region 38 is surrounded by cathode region 40.

Figure 7:
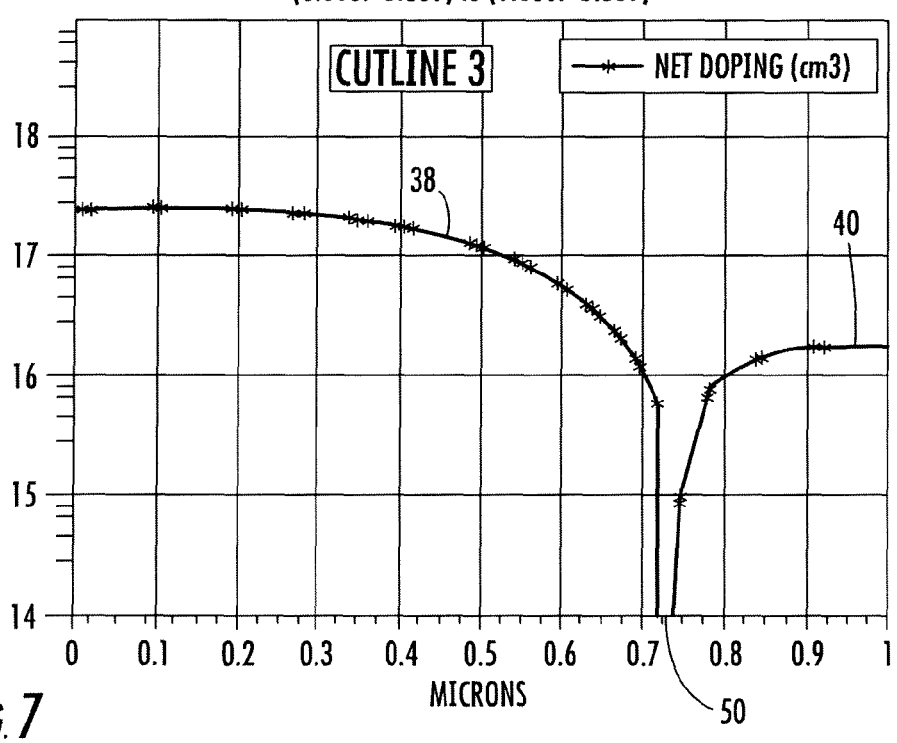
FIG. 7 is a graph of impurity concentration along cutline 3 of FIG. 6.

Even though the original implantation of the anode 38 and the cathode 40 are each for half a micron due to other heat steps in the process, the P-type impurities of the anode migrate laterally into the cathode region. FIG. 7 illustrates cutline 3 which is the lateral profile of the impurity concentrations. As will be noted, there is a small region 50 of approximately 0.05 microns where the n and p impurity concentrations of the anode 38 and cathode 40 cancel each other out and as well as the well region 34.

Figure 9:
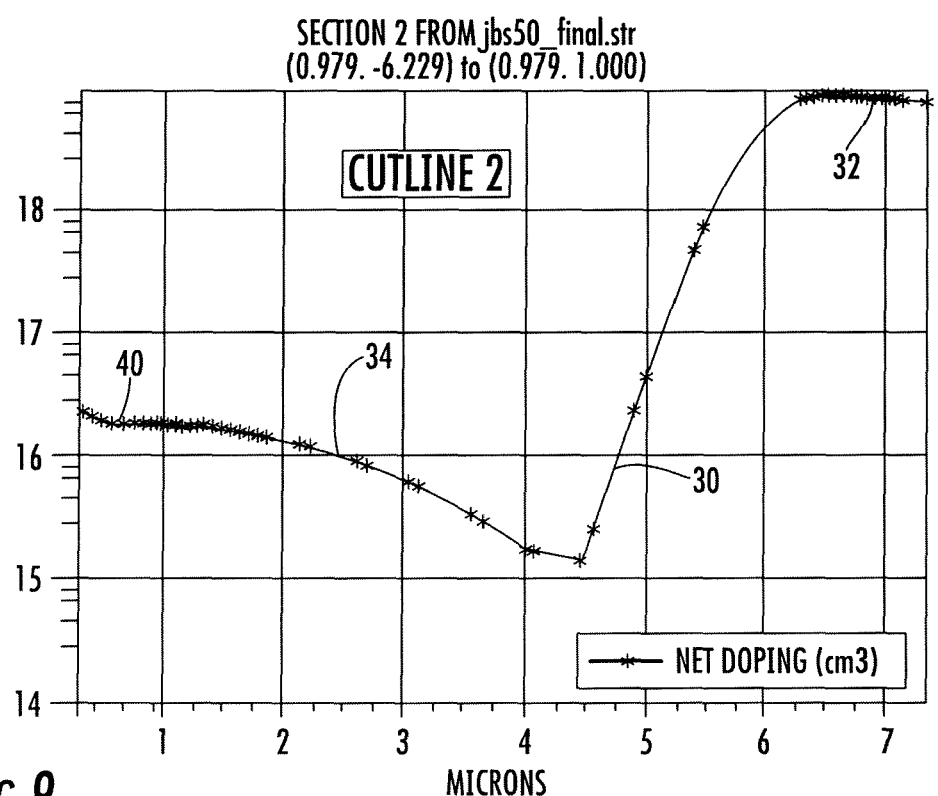
FIG. 9 is a graph of impurity concentration along cutline 2 of FIG. 6.

FIG. 8 illustrates at cutline 1, which is from the surface through the anode region 38 into regions 34, 30 and 32. It should be noted at about approximately a half micron below the surface is the peak impurity concentration for the anode region 38. This peak is greater than $1\times10^{17}$ carriers per cubic centimeter. The surface cathode region 40 has a peak impurity concentration of just greater than $1\times10^{16}$ carriers per cubic centimeter. That is true for FIGS. 7 and 9. Cutline 2 illustrates the specific doping profile for the cathode region 40, and regions 34, 30 and 32. The cathode region may also be formed to have a peak impurity concentration below the surface. The structure shown produces a reverse blocking voltage of least 60 volts.

A modification to the junction barrier Schottky diode of FIGS. 1 and 6 is illustrated in FIG. 10. A P-type anode 38A is surrounded by an N-type cathode 40 which is surrounded by a P-type anode 38B. An N+ cathode contact region 46 surrounds the diode structure. In this structure, the anode regions 38 are spaced from the cathode regions 40 and the cathode contact regions 46 by a surface portion of the N− region 34 of the well. The spacing X at the photo resists or mask level is from 1.0 microns (as shown in FIG. 10) to an overlap of 1 micron (as shown in FIGS. 6 and 7). The maximum impurity concentration in the spaced region is in the center laterally or horizontally. The lateral dimension Y for the cathode regions 40 and the lateral dimension Z for the anode regions 38 are each from 0.5 to 2.0 microns at the mask level.

Although the present disclosure has been described and illustrated in detail, it is to be clearly understood that this is done by way of illustration and example only and is not to be taken by way of limitation. The present junction barrier Schottky diode may also be a discrete device. The scope of the present disclosure is to be limited only by the terms of the appended claims.

What is claimed:

1. A junction barrier Schottky diode, the diode comprising:
an N-type well having a surface and a first peak impurity concentration along a vertical axis;
a P-type anode region in the surface of the well, and having a second peak impurity concentration along a vertical axis;
an N-type cathode contact region in the surface of the well and laterally spaced from a first wall of the anode region, and having a third peak impurity concentration along a vertical axis;
a first N-type region in the surface of the well and laterally spaced from a second wall of the anode region, and having a fourth impurity concentration along a vertical axis;
the center of the spaced region between the first N-type region and the second wall of the anode region having a fifth peak impurity concentration along a horizontal axis;
an ohmic contact to the anode region and cathode contact region, and a Schottky contact to the first N-type region; and
the first and fifth peak impurity concentrations being less than the fourth peak impurity concentration, and the fourth peak impurity concentration being less than the second and third peak impurity concentrations.

2. The diode of claim 1, wherein the second peak impurity concentration is less than the third peak impurity concentration.

3. The diode of claim 1, wherein the spaced region is the well and the first and fifth peak impurity concentrations are equal.

4. The diode of claim 1, wherein the fifth peak impurity concentration is less than the first peak impurity concentration, and the fifth peak impurity concentration in the spaced region results from overlap of the anode and the first N-type regions.

5. The diode of claim 1, wherein the cathode contact region, the anode region and the first N-type region have substantially the same depth.

6. The diode of claim 1, wherein the cathode contact region, the anode region and the first N-type region are concentric.

7. The diode of claim 1, including a spaced pair of one of the cathode contact region, the anode region and the first N-type region and wherein one of the anode and the first N-type region is between the spaced pair of cathode contact regions, one of the cathode contact region and the first N-type region is between the spaced pair of anode regions, or one of the anode region and the cathode contact region is between the spaced pair of first N-type regions.

8. The diode of claim 1, wherein the peak impurity concentration of the anode region is below the surface.

9. The diode of claim 1, wherein the peak impurity concentration of the first N-type region is below the surface.

10. The diode of claim 1, wherein the first N-type region is formed between two anode regions.

11. The diode of claim 1, including a Schottky contact to the spaced region and the well.

* * * * *